United States Patent
Bruno et al.

Patent Number: 6,099,970
Date of Patent: Aug. 8, 2000

[54] HIGH ELECTRON MOBILITY TRANSPARENT CONDUCTOR

[75] Inventors: William M. Bruno, Downey; Maurice P. Bianchi, Palos Verdes Estates, both of Calif.

[73] Assignee: TRW Inc., Redondo Beach, Calif.

[21] Appl. No.: 09/248,408

[22] Filed: Feb. 11, 1999

Related U.S. Application Data

[62] Division of application No. 08/798,349, Feb. 10, 1997.

[51] Int. Cl.$^7$ .......................................................... H01L 3/19
[52] U.S. Cl. .......................... 428/432; 428/426; 428/697; 428/698; 428/699; 428/701; 428/702
[58] Field of Search .................................... 428/698, 701, 428/702, 212, 426, 432, 697, 699

[56] References Cited

U.S. PATENT DOCUMENTS 4,862,471  8/1989  Pankove ..................................... 372/45

OTHER PUBLICATIONS

English abstract of JP 06–053532, Feb. 25, 1994.
Sitar et al "AlN/GaN Superlattices Grown By Gas SourceMolecular BeamEpitaxy", 17th Int'l Conf. on Metallurgical Coatings and 8th Inter'l Conference on ThinFilm, San Diego, CA, pp. 311–320, Apr. 2, 1990.
Bhargava "Blue and UV Light Emitting Diodes and Lasers", Optoelectronics Devices andTechnologies, vol. 7, No. 1, pp. 19–47, Jun. 1992.

Primary Examiner—Archene Turner
Attorney, Agent, or Firm—Michael S. Yatsko

[57] ABSTRACT

A transparent electrical conductor which provides relatively high electrical conductivity and transmittance in the visible/near-infrared (VNIR), relative to known transparent electrical conductors, such as tin-doped indium oxide (ITO). In one embodiment of the invention, the transparent electrical conductor is formed from a plurality of quantum wells formed between the interfaces of three layers of lattice-matched, wide band gap materials, such as AlGaN and GaN. In an alternative embodiment of the invention, a material with a band gap much larger than known materials used for such transparent electrical conductors, such as ITO, is selected. Both embodiments of the invention may be formed on a transparent substrate and provide relatively better transmittance in the VNIR at sheet electrical resistances of four or less ohms/square than known materials, such as tin-doped indium oxide (ITO).

13 Claims, 1 Drawing Sheet

HIGH ELECTRON MOBILITY TRANSPARENT CONDUCTOR

This application is a divisional of application Ser. No. 08/798,349 filed on Feb. 10, 1997 pending.

BACKGROUND OF THE INVENTION

1. Field of the Invention

The present invention relates to a transparent electrical conductor and, more particularly, to a transparent electrical conductor for use as an electrical conductor in a frequency range from DC to radio frequency (RF) that is transparent to visible light, formed with an electrical sheet conductance and a visible light transparency better than known transparent electrical conductors, such as tin-doped indium oxide (ITO).

2. Description of the Prior Art

Various opto-electronic devices require transparent electrical conductors that are conductive in the frequency range from DC to radio frequency (RF) and transparent to visible light. Such transparent electrical conductors are known to be applied to such opto-electronic devices in the form of a coating, and have become known as transparent conductive coating (TCC) materials.

Various applications of such TCC materials are known. For example, such TCC materials are known to be used for electrically resistive heating systems for aircraft windshields, as well as in satellite applications. Solar cells are also known to use such TCC materials. In particular, in solar cells applications, the TCC material is used for conducting solar photon-generated currents from the surface of the solar cells, without causing the solar cell to be obscured. Such TCC materials are also known to be used in various other opto-electronic applications, such as liquid crystal displays, CCD camera sensors and photocopiers, as well as a myriad of other opto-electronic type devices.

Various semiconductor coatings with a relatively wide band gap are known to be used for such TCC materials. Specifically, materials having a band gap greater than the energy of the photons of light passed therethrough are known to be used. For transparency across the entire visible/near-infrared (VNIR) band, materials with band gaps wider than 3 eV are known to be used.

In many known applications of such TCC materials, electrical conductivity for such TCC materials approaching that of metals is required. In order for the material to be electrically conductive, one or more of the electron energy bands of the material must be partially filled. In relatively high conductive materials, a partially filled electron energy band normally dominates the conduction.

The density of carriers in the electron energy band, n, required for a specific conductivity, is given by Equation (1).

$$n = \delta/q\mu, \quad (1)$$

where q is the electronic charge, $\mu$ is the carrier mobility, and $\delta$ is the electrical conductivity.

To obtain a sufficient density of carriers in an electron energy band for the desired conductivity, the material is known to be doped because the Fermi level of the intrinsic (pure) material is normally deep within the band gap. However, doping is known to reduce the transmittance of the material for several reasons. First, the optical absorption of free carriers increases with the increasing concentration of carriers, as generally discussed in "Optical Processes in Semiconductors", by J. I. Pankove, *Dover Publications*, 1971, p.75. Second doping is known to change the density of states function, producing a tail on the absorption near the band edge, as generally discussed in "Absorption Edge of Impure Gallium Arsenide", by J. I. Pankove, *Physical Review A*, Vol. 140, 1965, pp. 2059–2065. The increase in absorption as a function of the doping level thus causes a fundamental trade-off in such TCC materials between electrical conductivity and VNIR transmittance.

Tin-doped indium oxide (ITO) is known to be used for such TCC material applications. As generally set forth in "Transparent Conductors—A Status Review", by K. L. Chopra, S. Major, and D. K. Pandya, *Thin Film Solids*, Vol. 102, 1983, pps. 1–46, such ITO coatings are known to have an electron mobility ranging from 15–40 cm$^2$/V-s. In many known commercial and aerospace applications, transparent electrical conductors having a sheet electrical conductance of 1 or less ohms per square and a visible light transparency of 90% or better is required. Because of the high refractive index of these conductive coatings, an optical anti-reflection coating would be needed to achieve this transparency over the visible band. A sheet electrical impedance of one ohm per square of the ITO coating requires a doping concentration of about $2 \times 10^{21}$ cm$^{-3}$. Unfortunately, such highly doped ITO coatings provide less than approximately 75% VNIR transmittance.

SUMMARY OF THE INVENTION

It is an object of the present invention to solve various problems in the prior art.

It is yet another object of the present invention to provide a transparent electrically conductive material having relatively high electrical conductivity and relatively high transmittance.

Briefly, the present invention relates to a transparent electrical conductor which provides relatively high electrical conductivity and transmittance in the visible/near-infrared (VNIR), relative to known transparent electrical conductors, such as tin-doped indium oxide (ITO). In one embodiment of the invention, the transparent electrical conductor is formed from a plurality of quantum wells formed between the interfaces of three layers of lattice-matched, wide band gap materials, such as AlGaN and GaN. In an alternative embodiment of the invention, a material with a band gap much wider than known materials used for such transparent electrical conductors, such as ITO, is selected. Both embodiments of the invention may be formed on a transparent substrate and provide relatively better transmittance in the VNIR and relatively lower sheet electrical resistances of 4 or less ohms/square than known materials, such as tin-doped indium oxide (ITO). High levels of mobility can be obtained in quantum wells, as compared to bulk material with similar carrier concentration, because the dopants from which the carriers originate can be placed in the barrier layers. Separation of the dopants from the quantum wells in which the carriers accumulate reduces impurity scattering, resulting in increased mobility. Restricting the dopant atoms to the barrier layers is called modulation doping. A variety of techniques can be used to deposit these transparent conductors on appropriate substrates, both in bulk and as multi-quantum wells. These techniques are metal-organic vapor phase epitaxy (MOVPE), molecular beam epitaxy (MBE), hydride vapor phase epitaxy (HVPE), etc. which are used by researchers as well as the semiconductor industry to deposit crystalline semiconductor materials in these forms.

BRIEF DESCRIPTION OF THE DRAWING

These and other objects of the present invention will be readily understood with reference to the following specification and attached drawing, wherein.

DETAILED DESCRIPTION OF THE INVENTION

Figure 1:
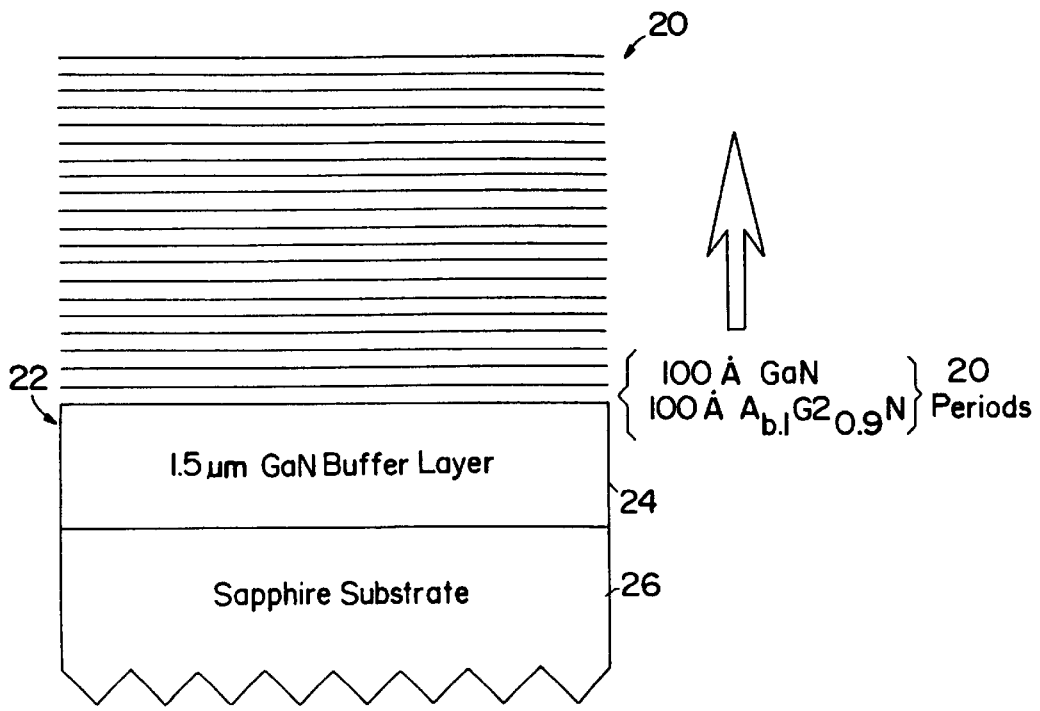
FIG. 1 is an exemplary elevational view of a transparent electrical conductor formed in accordance with the present invention, which includes twenty quantum wells formed in GaN between the interfaces with adjacent AlGa-N layers, formed with a GaN buffer layer on a substrate.
Figure 2:
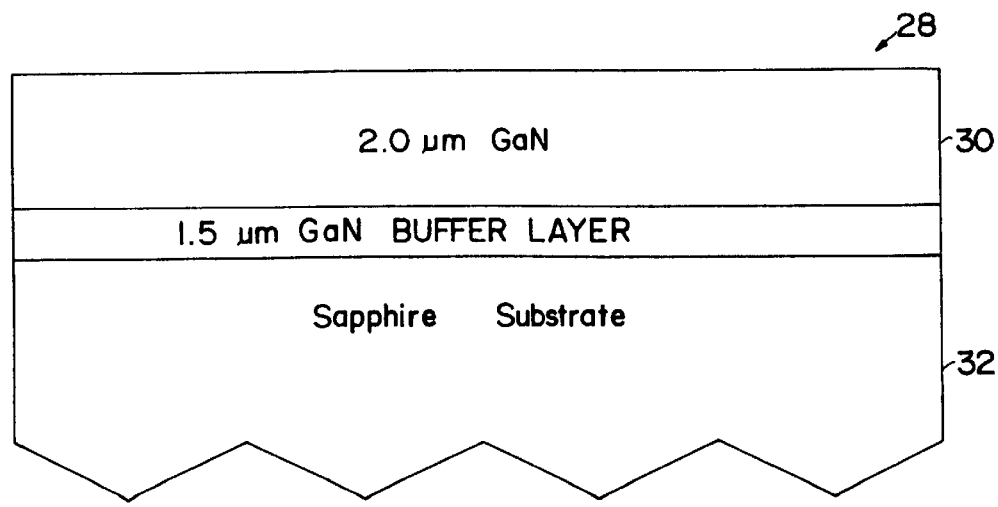
FIG. 2 is an elevational view of an alternative embodiment of the invention utilizing GaN formed on a 2 micron thick GaN buffer layer on a sapphire substrate.

Two embodiments of the invention are illustrated in FIGS. 1 and 2. Both embodiments provide relatively higher electrical conductivity with reduced optical losses than known transparent electrical conductors, such as tin-doped indium oxide (ITO). Both embodiments utilize materials with a relatively wide band gap and a carrier mobility significantly larger than that of ITO, in order to reduce doping, while maintaining the desired electrical conductivity. As discussed above, the doping is required to achieve the desired electrical conductivity of the material. Unfortunately, such doping also results in optical losses, thus reducing the transmittance in the VNIR to unacceptable levels.

The first embodiment of the invention is illustrated in FIG. 1. In this embodiment, the transparent conductive coating (TCC) is formed as a plurality of modulation doped quantum wells formed between the interfaces of three layers of lattice matched, wide band gap crystalline materials. The quantum well between the two lattice matched, wide band gap crystalline materials provides relatively higher electron mobility than the electron mobility in the same bulk materials for the same electron concentrations, as discussed in "Electron Mobility in Single and Multiple-Period Modulation-Doped (Al,Ga) As Heterostructures", by T. J. Drummond, et al., *Journal of Applied Physics*, Vol. 53, No. 2, February 1982, pps. 1023–1027; and "Observation of Two-Dimensional Electron Gas in Low Pressure Metal Organic Chemical Vapor Deposited GaN-Al$_x$Ga$_{1-x}$N Heterojunction", by M. Asif Kahn, et al., *Applied Physics Letters*, Vol. 60, No. 24, Jun. 15, 1992, pps. 3027–3029. For materials such as AlGaN and GaN, such two-dimensional quantum well structures are known to have electron mobilities as high as 1500 cm$^2$/V-s at 300° K Kelvin, while the electron mobility of a similarly doped bulk GaN is known to be only 300 cm$^2$/V-s. As set forth in "GaN, AlN, and InN: A Review", by S. Strite and H. Morkoc, *Journal of Vacuum Science and Technology B*, Vol. 10, No. 4, July–Aug. 1992, pps. 1237–1266, both AlGaN and GaN have relatively wide band gaps of 6.2 eV and 3.4 eV, respectively. Moreover, as set forth in "The Preparation and Properties of Vapor Deposited Single Crystalline GaN", by H. P. Maruska and J. J. Tietjen, *Applied Physics Letters*, Vol. 15, No. 10, Nov. 15, 1969, pps. 327–329, both AlGaN and GaN have high optical transparency.

Referring to FIG. 1, the transparent electrical conductor in accordance with one embodiment of the invention is formed from a plurality of quantum wells between the interfaces of three layers of lattice-matched, wide band gap crystalline materials, for example, GaN and AlGaN. In this embodiment, the quantum wells 22 are formed by layers of GaN sandwiched between AlGaN barrier layers. Since the sheet resistance, $R_s$ of a plain sheet of materials equals $1/qN_A\mu$, where $N_A$ is the number of carriers per unit area, the sheet-charge density required for sheet resistance of one ohm/square would be $2\times10^{14}$, assuming a stack of 20 quantum wells, as generally illustrated in FIG. 1. Alternatively, a stack of 200 quantum wells each with a sheet charge density of $2\times10^{13}$ cm$^{-2}$ and mobility of 1500 cm$^2$/V-s would also have a sheet resistance of 1 Ohm/Sq. Each quantum well, generally identified with the reference numeral 22, is formed between the interfaces of, for example, 100 A of Al$_{0.1}$ GaN$_{0.9}$ N, 100 A of GaN, and 100 A of Al$_{0.1}$Ga$_{0.9}$N. These quantum wells 22 may be formed on a buffer layer 24, formed, for example, of 1.5 μm of GaN. The buffer layer 24 may be, in turn, formed on a transparent substrate 26, such as a sapphire substrate.

The electrically conductive coating 20 illustrated in FIG. 1 is relatively more complex than conventional amorphous TCCs. The complexity can be substantially eliminated by forming a transparent electrical conductor 28, as shown in FIG. 2, from a bulk crystalline material, such as GaN, which, as mentioned above, has an electron mobility of 300 cm$^2$/V-s at 300° K when doped with silicon atoms at a density of $10^{19}$ cm$^{-3}$—about ten times higher than the electron mobility of ITO. Thus, in accordance with an alternative embodiment of the invention, the transparent electrical conductor 28 is formed from a single n-type doped layer of a crystalline material, such as GaN, about 2 microns thick on a 2 micron thick buffer layer, on a transparent substrate 32, such as a sapphire substrate.

The transparent electrical conductor 28, illustrated in FIG. 2, outperforms known transparent electrical conductors, such as ITO. In particular, since the mobility of bulk GaN is about 10 times greater than that of ITO, an equal thickness of GaN will have an equal sheet resistance with one-tenth the carrier concentration. Since the sheet resistance, $R_S$, of a layer of GaN, having a thickness of δ and an electron concentration of n per unit volume equals $1/q\mu N\delta$, 2 microns of GaN will require an n-type doping level of about $10^{20}$ for a sheet resistance of about 1 ohm/square. At such a doping level, the contribution to the absorption coefficient from the free-carrier absorption is about 25× less than that for ITO, with the same sheet resistance. Since the absorption depends exponentially on the absorption coefficient, the free carrier absorption is substantially negligible for the structure illustrated in FIG. 2.

The classical formula for free carrier absorption is provided in Equation (2) below:

$$\alpha = nq^2\lambda^2/8\pi^2 Nmc^3\tau, \tag{2}$$

where

λ represents wavelength;

N represents refractive index;

m represents the electrons' effective mass in the conduction band;

c represents the speed of light in a vacuum;

τ represents the relaxation time for scattering of electrons; and

α equals the absorption coefficient.

As set forth in "Solid State Electronic Devices", Second Edition, by B. G. Streetman, Prentice-Hall, 1980, p. 83, the carrier mobility μ may be formulated in accordance with Equation 3, as follows:

$$\mu = q\tau/m \tag{3}$$

Substituting Equation 3 into Equation 2 yields Equation 4 as set forth below:

$$\alpha = nq^3\lambda^2/8\pi^2 Nm^2c^3\mu \quad (4)$$

Since m is roughly half as large for a crystalline material, such as GaN, as for ITO, n is 10× smaller for GaN, $\mu$ is 10× larger for GaN, while the other parameters are either identical or similar for both materials, the absorption coefficient $\alpha$ is about 25× smaller for GaN. The absorption by free carriers (i.e., transitions in which carriers in the partially filled band go to higher energy states in the same band) is ordinarily the dominant absorption mechanism in the IR(NIR) for conductive wide band gap materials, whereas the tail of the band edge absorption is dominant at visible wavelengths. The absorption for the GaN layer at visible wavelengths approaching the band-edge absorption, as illustrated in FIG. 2, is expected to be less than 10 percent for wavelengths to 400 nm based on the optical absorption measurements on a similarly doped GaN. Thus, over the visible range, 10 percent is the maximum absorption for GaN.

The transparent electrical conductors 20 and 28 may be formed on transparent substrates 26 and 32, such as sapphire, respectively. In addition to sapphire, the substrates 26 and 32 may be formed from other substrate materials, such as SiC, which provides better lattice and thermal matching. Other materials are also contemplated for the substrates 26 and 32, such as ZnO and GaN. A GaN substrate provides optimal matching of the lattice and the thermal expansion coefficient.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A transparent electrical conductor suitable for use as a transparent conductive coating (TCC) in various optoelectronic applications, the transparent electrical conductor comprising:

a transparent substrate; and an electrically conductive material formed on said substrate, wherein said electrically conductive material is formed from a plurality of quantum wells where at least one of said quantum wells is formed of a layer GaN sandwiched between layers AlGaN.

2. The transparent electrical conductor as recited in claim 1, wherein said substrate is formed from sapphire.

3. The transparent electrical conductor as recited in claim 1, wherein said substrate is formed from SiC.

4. The transparent electrical conductor as recited in claim 1, wherein said substrate is formed from GaN.

5. The transparent electrical conductor as recited in claim 1, wherein said substrate is formed from ZnO.

6. The transparent electrical conductor as recited in claim 1, wherein said quantum wells are formed from wide band gap crystalline materials.

7. The transparent electrical conductor as recited in claim 6, wherein the quantum wells are modulation doped.

8. The transparent electrical conductor as recited in claim 7, wherein said plurality is between 100 and 500.

9. The transparent electrical conductor as recited in claim 1, wherein said electrically conductive material is crystalline material having an electron mobility much higher than polycrystalline tin-doped indium oxide.

10. The transparent electrical conductor as recited in claim 1, wherein said transparent substrate is removed after said electrically conductive material is formed.

11. The transparent electrical conductor as recited in claim 9, wherein said buffer layer is formed from GaN.

12. A transparent electrical conductor suitable for use as a transparent conductive coating (TCC) in various optoelectronic applications the transparent electrical conductor comprising:

a transparent substrate; and an electrically conductive material formed on said substrate, wherein said electrically conductive material is bulk GaN.

13. The transparent electrical conductor as recited in claim 12, further including a buffer layer between said transparent substrate and said or bulk GaN.

* * * * *